United States Patent
Lamson et al.

(10) Patent No.: US 6,563,208 B2
(45) Date of Patent: May 13, 2003

(54) SEMICONDUCTOR PACKAGE WITH CONDUCTOR IMPEDANCE SELECTED DURING ASSEMBLY

(75) Inventors: Michael A. Lamson, Westminster, TX (US); Heping Yue, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 60 days.

(21) Appl. No.: 09/750,393

(22) Filed: Dec. 28, 2000

(65) Prior Publication Data

US 2002/0003291 A1 Jan. 10, 2002

Related U.S. Application Data

(60) Provisional application No. 60/173,450, filed on Dec. 29, 1999.

(51) Int. Cl.$^7$ ................................................ H01L 23/52
(52) U.S. Cl. .................... 257/691; 257/664; 438/652
(58) Field of Search ............................. 257/664, 691, 257/758; 438/652, 666

(56) References Cited

U.S. PATENT DOCUMENTS

| | | | | |
|---|---|---|---|---|
| 4,626,889 A | * | 12/1986 | Yamamoto et al. |
| 5,925,925 A | * | 7/1999 | Dehaine et al. |
| 6,137,168 A | * | 10/2000 | Kirkmnan |
| 6,172,305 B1 | * | 1/2001 | Tanahashi |
| 6,201,308 B1 | * | 3/2001 | Ikegami et al. |

\* cited by examiner

Primary Examiner—Sheila V. Clark
(74) Attorney, Agent, or Firm—Michael K. Skrehot; Wade James Brady, III; Frederick J. Telecky, Jr.

(57) ABSTRACT

A semiconductor package having a plurality of conductors arrayed in two (or more) parallel planes, and an available ground conductor. Conductors in the auxiliary or second plane substantially overlay the primary signal conductors in the first plane, and the impedance of any lead or lead pair is arbitrarily set at the assembly process by connecting the auxiliary conductors to ground or by leaving them floating. Differential pairs of signal conductors, either odd or even mode are set by connecting the auxiliary conductors to a ground contact.

13 Claims, 7 Drawing Sheets

SEMICONDUCTOR PACKAGE WITH CONDUCTOR IMPEDANCE SELECTED DURING ASSEMBLY

This application claims the benefit of Provisional application Ser. No. 60/173,450, filed Dec. 29, 1999.

FIELD OF THE INVENTION

This invention relates generally to a semiconductor package, and more particularly to the impedance of conductors in a semiconductor package.

BACKGROUND OF THE INVENTION

In order to maintain signal integrity, the design of high speed integrated circuit (IC) devices requires specific characteristic impedance of conductors which interconnect an IC chip to a printed wiring board or the next level of interconnection. For example, clock circuit drivers of many high frequency circuits are designed for 50 ohm matched impedance, and this in turn necessitates a specific geometric conductor design, and a predetermined output location for the conductor system in a package or substrate to match the circuit design. Moreover, the conductor system within a substrate or package used for both single ended and differential signal transmission has different impedance levels for each mode, and thus a specific conductor design for individual devices.

Arrays of conductors provide transmission lines in semiconductor packages or substrates; these arrays or systems include signal layer(s), and a ground conductor(s) which may be within the substrate, the printed wiring board or the semiconductor chip itself. The conductive layers are interspaced with dielectric materials. Characteristic impedance of the conductors is a function of conductor spacing, dielectric thickness, conductor width, the electrical properties of the materials, and the velocity of signal propagation on the line.

Differential impedance between a pair of conductors is either odd mode or even mode depending upon the direction of signal propagation, and for some circuits the need for both modes exists within the same device. This is particularly true of higher frequency and microwave devices designed for even mode impedance, often at 100 ohms.

The ongoing proliferation of high speed circuits with specific conductor requirements places a difficult and costly demand for as many package or substrate designs. A need exists for more flexible conductor systems which accommodate a number of different circuit design requirements.

SUMMARY OF THE INVENTION

The primary object of the invention is to provide a multiple use conductor system for interconnecting an integrated circuit chip to an external circuit wherein the impedance level of the conductors serving as transmission lines can be arbitrarily selected.

It is an object of the invention to provide a semiconductor package having conductors wherein the impedance can be selected for individual leads or lead pairs.

It is an object of the invention to provide a semiconductor package wherein the characteristic impedance of the conductors can be selected for single ended or differential pairs of transmission lines, as well as for odd and even mode differential transmission lines within the same package.

It is an object of the invention to provide a semiconductor package wherein the impedance level of the conductors is established during the assembly of the circuit.

It is an object of the invention to provide a semiconductor package which is usable for many chip designs, and thus reduces the costs associated with tooling, inventory, and package design.

It is further an object that the interconnection of the conductors is compatible with either wire bond or flip chip interconnection.

Yet another objective is to provide a flexible conductor system which is usable with different types of packages or substrates.

It is an object of one embodiment of the invention to provide a conductor system wherein single ended and differential mode transmission can be mixed within the same conductor system.

The invention is a microelectronic device, and a method of fabricating the device, wherein the impedance of single ended or differential signal transmission lines is determined by the choice of which conductors are connected to ground during the assembly of the semiconductor device. Moreover, the device is applicable to pairs of conductors having odd or even mode impedance within the same conductor system.

In one embodiment, the device is a semiconductor package having a plurality of conductors arrayed in two (or more) parallel planes, and a ground conductor. Each of the primary conductors has the same dimensions and spacing between conductors, and each of the auxiliary conductors has the same dimensions and spacing. Conductors in the auxiliary or second plane substantially overlay the primary signal conductors in the first plane, and the impedance of any lead or lead pair is arbitrarily set by connecting the auxiliary conductors to ground or by leaving them floating. Differential pairs of signal conductors, either odd or even mode are set by connecting the auxiliary conductors to a ground contact.

In an alternate embodiment, a conductor system is provided wherein single ended and differential impedance modes are mixed within the same package or substrate. Conductors are arrayed in two (or more) parallel planes, with an available ground conductor, and the auxiliary conductors substantially overlay the primary conductors. Conductor dimensions and spacing are set to provide alternating impedance modes.

DETAILED DESCRIPTION OF THE DRAWINGS

Figure 1:
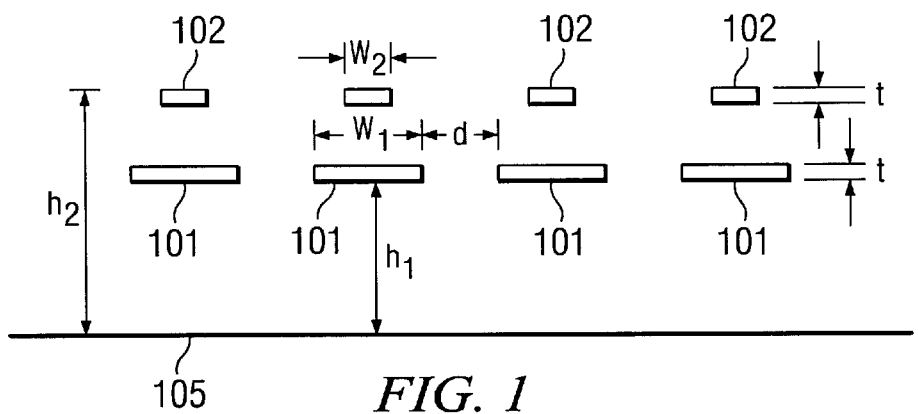
FIG. 1 is a cross sectional design of conductors of the current invention.

FIG. 1 provides a cross section of the conductors of the current invention, wherein a ground plane 105 exists either in the package, the chip, or the next level of interconnection, typically a printed wiring board. A first level or primary conductors 101 are positioned at a distance "$h_1$" above the ground plane 105 and have a defined width "$w_1$", and a separation "d" from the adjacent primary conductor. An auxiliary or second level 102 of conductors having width "$w_2$" is positioned above the primary conductors 101 at a distance "$h_2$" above the ground plane, and substantially follow the path of the primary conductors throughout the conductor system. The conductors 101 and 102 are of the same material and have thickness "t". The conductors are interspaced with a dielectric material.

Figure 2:
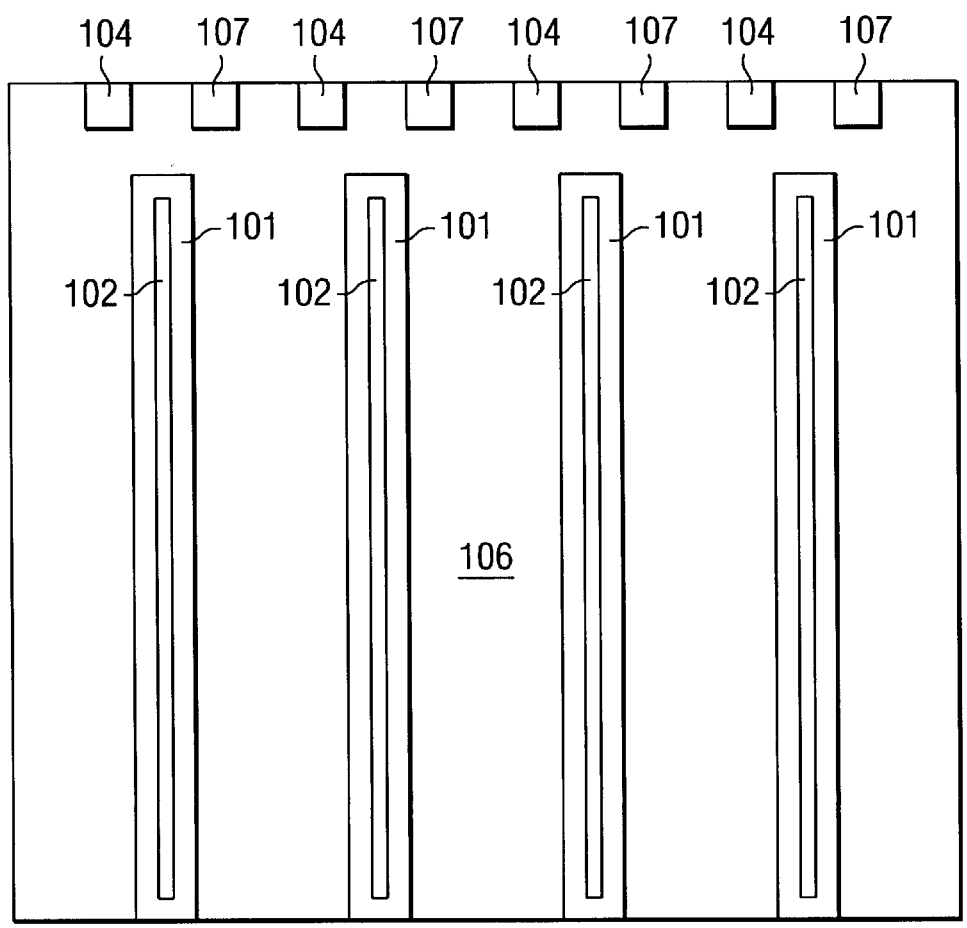
FIG. 2 shows the overlaying conductors from a top view.

FIG. 2 provides a top view of the conductors 102 and 101 showing the position furthermost from the ground source. From this view it can be seen that an auxiliary conductor 102 lies directly above each of the primary conductors 101. Contact pads 104 and 107 are located on the substrate 106.

It is known by those skilled in the art that the impedance of a conductor or lead is a function of inductance and capacitance of the conductors, and is determined by the height above the ground plane, and the conductor width, and that for single ended transmission lines, impedance is a function of the spacing between the conductors. It is further recognized that the ratio of "h" and "w" is the same for each conductor in a given signal layer if the impedance of the conductors is to be substantially the same. The general equation for a impedance "Z" of a conductor is given by:

$$Z = 60/\sqrt{\epsilon_e} \bullet \{ln(8 h/w + w/4 h)\}$$

$$\epsilon_e = (\epsilon_r + 1)/2 + (\epsilon_r - 1)/2 \{1/\sqrt{1 + 12 h/w}\}$$

Figure 3:
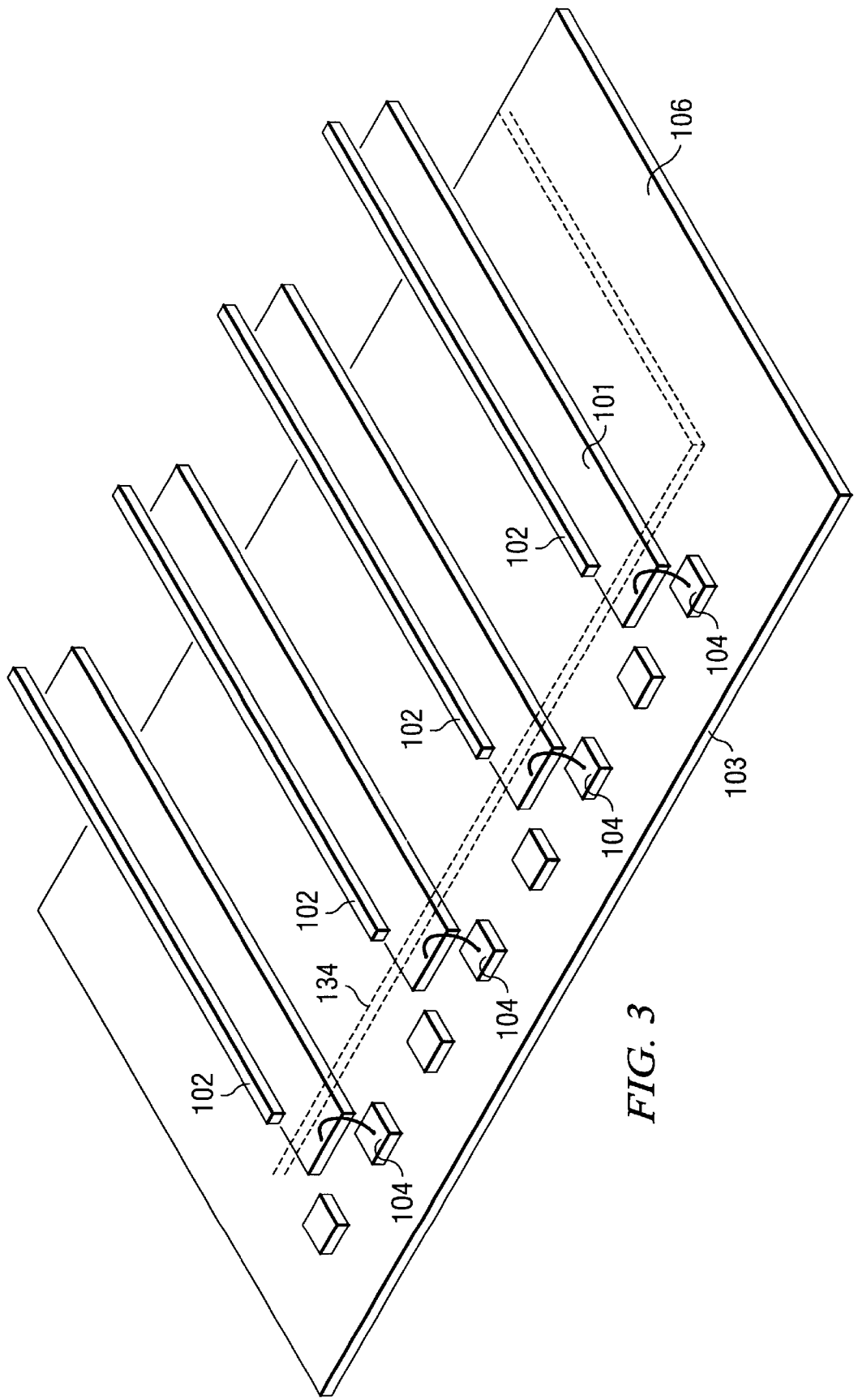
FIG. 3 illustrates bond selection of the primary conductors for differential mode transmission

In FIG. 1 all primary conductors 101 in the system are designed for a selected impedance level, taking into account the known geometric constraints discussed previously, the dielectric constant of the materials of construction and the resistivity of the conductors. FIG. 3 shows the primary conductors 101 electrically connected to an output signal pin 104 of the package or substrate 106. In this embodiment, the electrical connections are made by way of a wire bond. The auxiliary conductors 102 are "floating" or unattached to any other conductor, and the impedance values of the auxiliary conductors are of no concern to the device performance. A dielectric layer 134 separates the two conductor layers and the dielectric thickness is equal to the difference between "$h_1$" and "$h_2$" in FIG. 1.

This transmission configuration provides impedance results of the primary conductors which are have only slightly different from a device with a single level of conductors; i.e., the auxiliary conductors cause a minor change in the capacitance values which results in only minor changes in the impedance values. The bonding configuration, shown in FIG. 3 is used with differential mode transmission lines.

Figure 4:
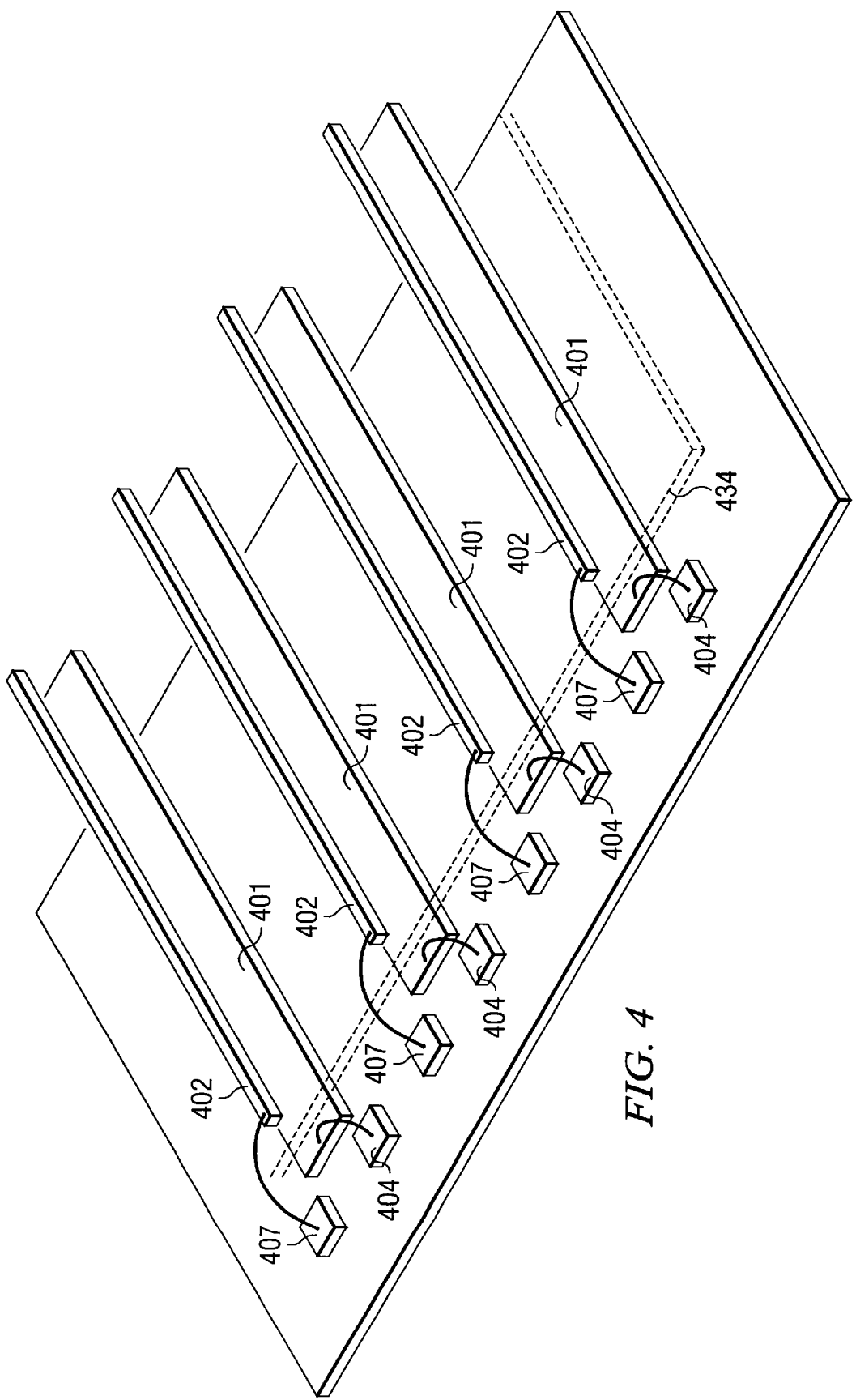
FIG. 4 illustrates bond selection of the primary and ground conductors for single ended signal transmission.

Turning now to FIG. 4, each of the primary conductors 401 is connected to a signal output pin 404, and each of the overlying auxiliary conductors 402 is electrically connected to a ground contact 407. A dielectric layer 434 separates the primary and auxiliary conductor levels. This configuration provides a connection for single ended transmission by the primary conductors. Connection of the auxiliary conductors 402 to ground essentially sandwiches the primary conductors between two ground levels; i.e., the ground plane within the package or board, and a second isolated ground plane formed by the auxiliary conductors when attached to a ground contact.

From FIGS. 3 and 4, it is apparent that the impedance of the conductors of the current invention are arbitrarily selected as single ended or differential mode transmission lines depending on connection to ground.

Figure 5:
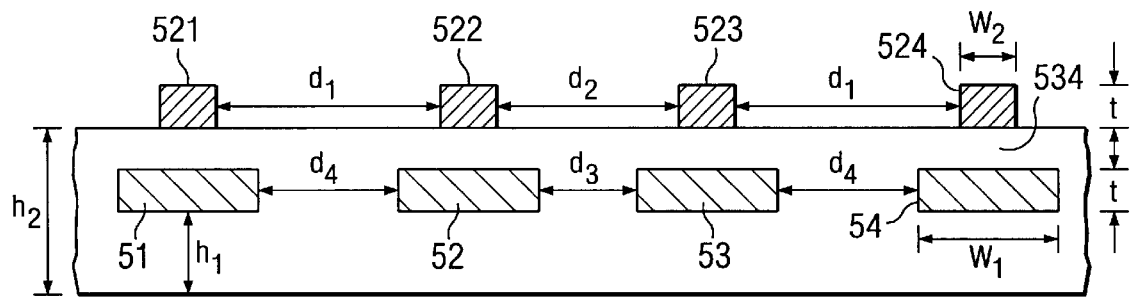
FIG. 5 is a cross sectional diagram of a conductor system applicable to mixed mode, to single ended, or to a differential pair of transmission lines.
Figure 6:
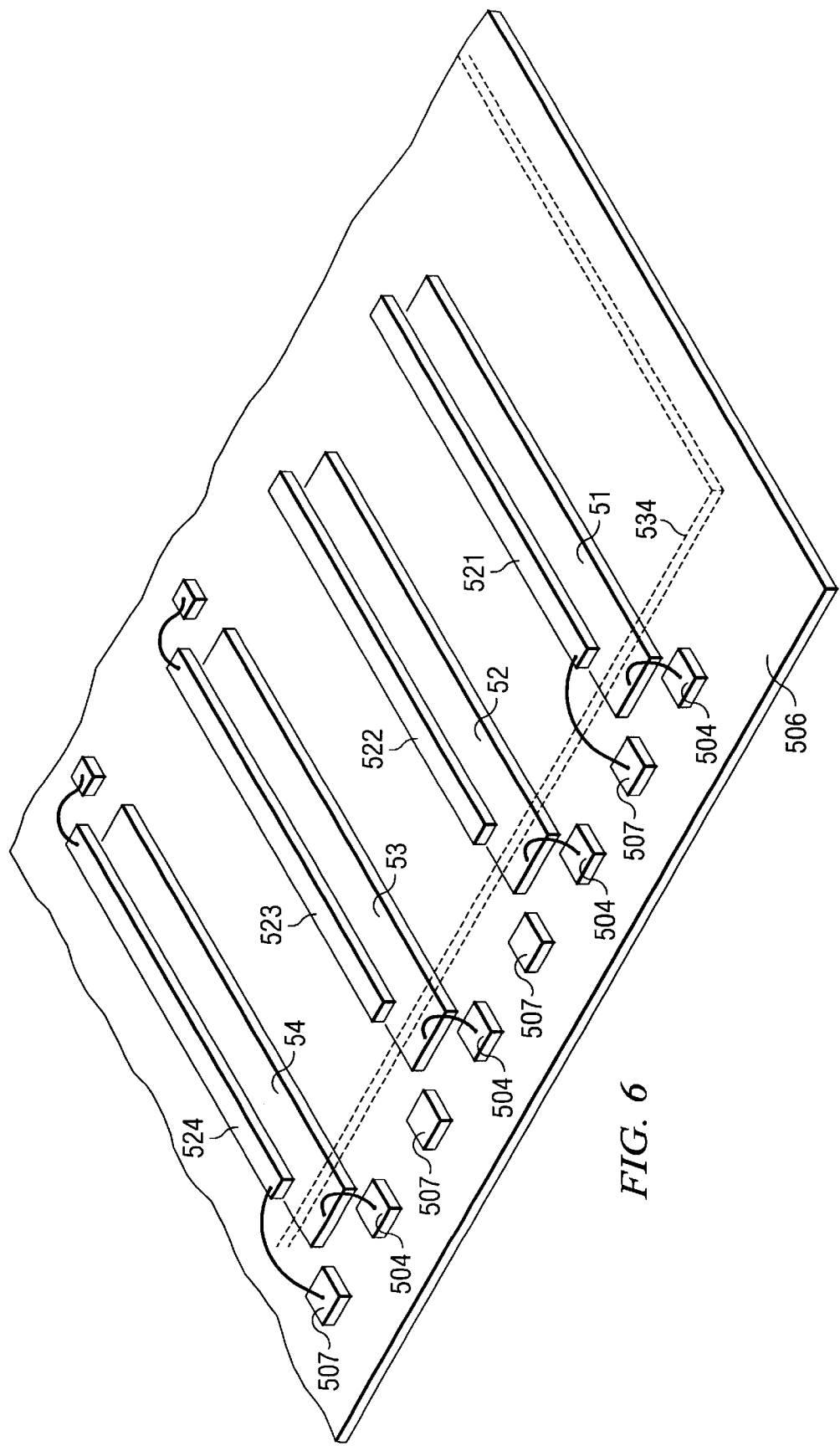
FIG. 6 illustrates a mixed transmission mode conductor system in the same device.

In an alternate embodiment, illustrated in FIGS. 5 and 6, it can be seen that modes can be mixed within a conductor system having an array of primary conductors 51, 52, 53, and 54, and a parallel array of auxiliary conductors 521, 522, 523, and 524 substantially overlaying the primary conductors, and separated by a dielectric layer 534. In this embodiment, spacing of the primary and auxiliary conductors are not uniform throughout the respective conductor planes, but are spaced at predetermined distances to allow mixed mode impedance, single ended impedance or differential impedance depending upon the connection of the auxiliary conductors to ground.

In each application, the primary conductors 51, 52, 53, 54 are connected to signal output pins or pads. In an application requiring single ended transmission lines, all auxiliary conductors 521, 522, 523 and 524 are connected to ground 507. In an application requiring a differential pair, the auxiliary conductors are floating or not connected, and the center pair 52 and 53 are spaced and dimensioned to provide a differential pair of specified impedance.

For the application of mixed modes, the conductors 52 and 53 are made the differential transmission lines, and leads 51 and 54 are made single ended transmission lines by attaching auxiliary conductors 521 and 524 to ground 507.

The configuration of mixed mode is further illustrated in FIG. 6. Each primary conductor is electrically connected to an output pad 504, and auxiliary conductors 521 and 524 are connected to ground contact 507, thereby a device having a pair of differential transmission lines, 52 and 53, and two single ended lines 51 and 54.

In order to insure proper signal transmission and timing, prediction and control of electrical parameters of a packaging system is analyzed using computer modeling and simulation program. Such electrical modeling programs are both commercially available, and have been developed by a number of university programs. The geometry and material properties of a series of conductors and insulators are input to the program, and the output includes capacitance, inductance of the conductors and the resulting impedance of the lead in question, and of the surrounding leads. The results of such analyses are then input to a simulation model to predict a circuit performance.

Validity of the current invention is illustrated by results of an electrical model of the device in FIGS. 3 and 4 are given in Tables 1 and 2 respectively.

Conductor material: Copper (resistivity=1.67 ohm cm) permeability ($\mu r$=1)

Substrate material: BT resin (dielectric constant=4) (dielectric loss tangent $\delta$=0)

Conductor design in mm

| | |
|---|---|
| $w_2$ = 0.0625 | $w_1$ = 0.125 |
| t = 0.02 | $d_1$ = 0.125 |
| $h_1$ = 0.251 | $h_2$ = 0.3615 |

TABLE 1

First Level Conductors With Differential Transmission Lines (Auxiliary Conductors Floating)

| | Conductor # | | | |
|---|---|---|---|---|
| | 1 | 2 | 3 | 4 |
| CAPACITANCE MATRIX (pf/cm) pico farads per centimeter | 1.32 | 1.39 | 1.39 | 1.32 |

TABLE 1-continued

First Level Conductors With
Differential Transmission Lines
(Auxiliary Conductors Floating)

| | Conductor # | | | |
|---|---|---|---|---|
| | 1 | 2 | 3 | 4 |
| INDUCTANCE MATRIX (nh/cm) nanohenries/cm | 5.00 | 5.00 | 5.07 | 5.07 |
| IMPEDANCE MATRIX (ohm) | 76.22 | 75.19 | 75.19 | 76.22 |
| adjacent lead | 25 | 25 | 25 | 25 |
| Differential mode Impedance | 51.22 | 50.19 | 50.19 | 51.22 |

TABLE 2

First Level Conductors With Single
Ended Transmission Lines
(Auxiliary Conductors Grounded)

| | Conductor # | | | |
|---|---|---|---|---|
| | 1 | 2 | 3 | 4 |
| CAPACITANCE MATRIX (pf/cm) pico farads per centimeter | 1.32 | 1.39 | 1.39 | 1.32 |
| INDUCTANCE MATRIX (nh/cm) nanohenries/cm | 3.44 | 3.33 | 3.35 | 3.44 |
| IMPEDANCE MATRIX (ohm) | 51.59 | 50.02 | 50.02 | 51.59 |

The single ended conductors of FIG. 4 were designed for 50 ohm impedance, and the model data shows the values to be within 5%. By connecting the specific auxiliary conductors to ground, differential impedance of the odd and even modes are within 3%.

An analysis of the mixed mode device in FIGS. 5 and 6, provides the results given in Table 3.

Conductor material: Copper (resistivity=1.67 ohm cm) (permeability $\mu r$=1)

Substrate material: BT resin (dielectric constant=4) (dielectric loss tangent $\delta$=0)

Conductor design in mm

| | |
|---|---|
| t = 0.02 | |
| $w_2$ = 0.02 | $w_1$ = 0.1 |
| $d_1$ = 0.53 | $d_2$ = 0.18 |
| $d_3$ = 0.1 | $d_4$ = 0.45 |
| $h_1$ = 0.192 | $h_2$ = 0.264 |

TABLE 3

| | Conductor # | | | |
|---|---|---|---|---|
| | 51 | 52 | 53 | 54 |
| Differential Transmission Lines 52, 53 (Auxiliary Conductors Floating) | | | | |
| CAPACITANCE MATRIX (pf/cm) pico farads per centimeter | 1.33 | 1.42 | 1.42 | 1.33 |
| INDUCTANCE MATRIX (nh/cm) nanohenries/cm | 5.00 | 4.93 | 4.93 | 5.00 |
| IMPEDANCE MATRIX (ohm) | 75.27 | 74.21 | 74.22 | 75.26 |
| adjacent lead | | 24.79 | 24.79 | |
| Differential mode Impedance | | 49.42 | 49.43 | |
| Conductors With Single Ended Transmission Lines (All Auxiliary Conductors Grounded) | | | | |
| CAPACITANCE MATRIX (pf/cm) picofarads per centimeter | 1.33 | 1.42 | 1.42 | 1.33 |
| INDUCTANCE MATRIX (nh/cm) nanohenries/cm | 3.33 | 3.22 | 3.21 | 3.33 |
| IMPEDANCE MATRIX (ohm) | 50.02 | 48.27 | 48.22 | 50.01 |
| Mixed Mode Transmission Lines Differential Pair 52, 53, Single Ended 51, 54 | | | | |
| CAPACITANCE MATRIX (pf/cm) picofarads per centimeter | 1.33 | 1.42 | 1.42 | 1.33 |
| INDUCTANCE MATRIX (nh/cm) nanohenries/cm | 3.34 | 4.88 | 4.88 | 3.34 |
| IMPEDANCE MATRIX (ohm) | 50.13 | 73.44 | 73.44 | 50.13 |
| adjacent lead | | 24.12 | 24.12 | |
| Differential mode Impedance | | 49.32 | 49.32 | |

Thus, in the preferred embodiment illustrated in FIGS. 3 and 4, and the analysis in Tables 1 and 2, a conductor system having overlaying conductors in a single device design is provided, and said design is compatible with various chip transmission requirements, thereby eliminating a need for specific package designs for various impedance matching conductors.

In the alternate embodiment, given in FIGS. 5 and 6 and the analysis in Table 3, a conductor system is shown which allows both single ended and differential mode impedance transmission lines within the same package, or allows either single ended or for differential transmission modes to be selected arbitrarily by the bonding configuration.

Figure 7:
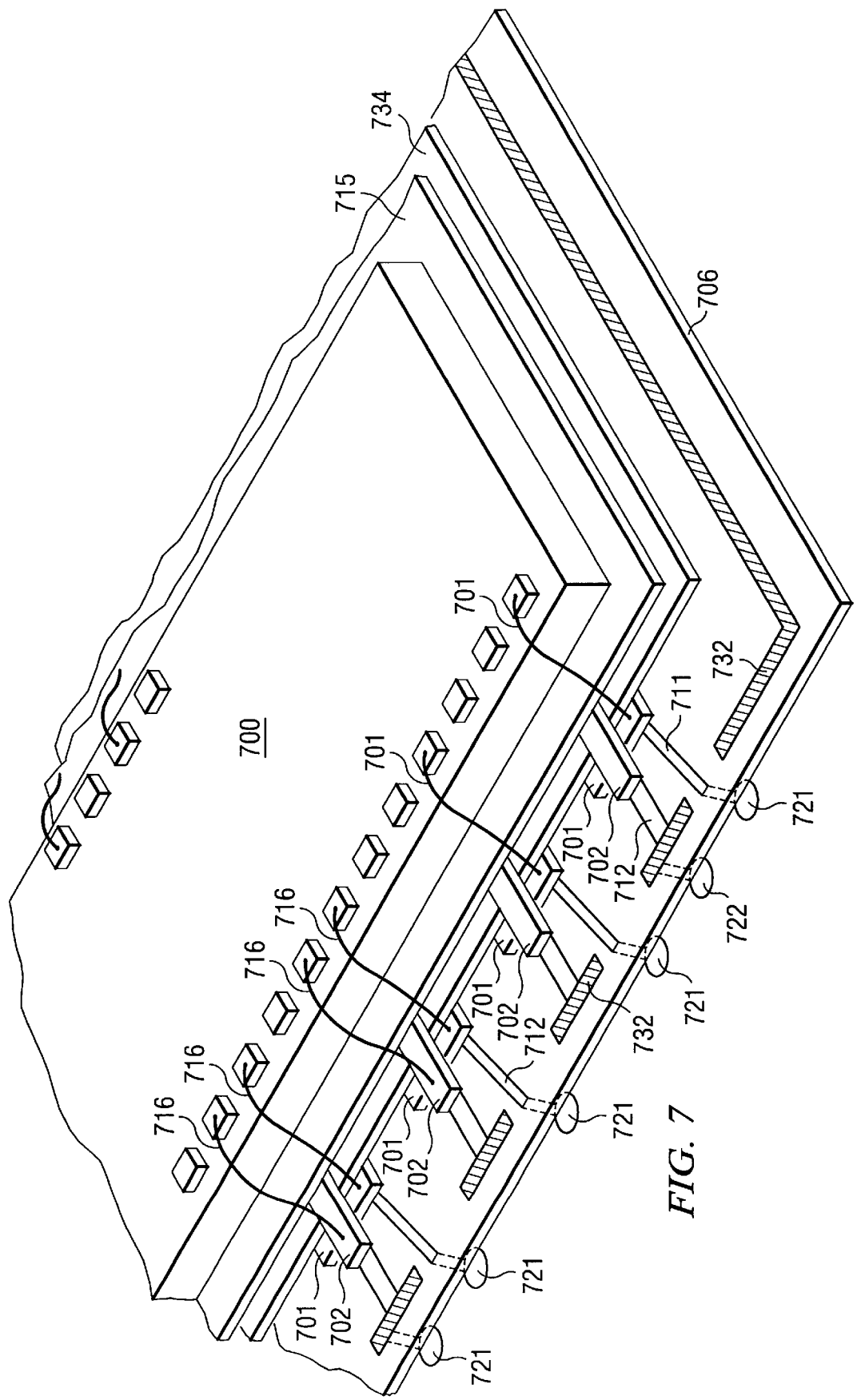
FIG. 7 is a Ball Grid Array package with single ended transmission lines.

FIG. 7 illustrates a preferred embodiment of the invention as a BGA (Ball Grid Array) semiconductor package. In this embodiment, the package substrate 706 is comprised of a composite material, such as BT resin having a dielectric constant of 4. The device includes a primary level of conductors 701 overlaid by a second level of auxiliary conductors 702, and the conductors separated by a layer of dielectric 734. Plated vias 711 connect each primary conductor 701 to an external solder ball contact 721. Plated vias 712 connect each second level conductor 702 to a ground plane 732 embedded within the package substrate, to an array of external solder ball contacts 722. An integrated circuit chip 700 is adhered to a chip pad 715 on the package substrate 706, and the chip 700 is connected by wire bonds 716 to selected conductors. The chip and conductor system are encapsulated in a plastic material (not shown).

Figure 8:
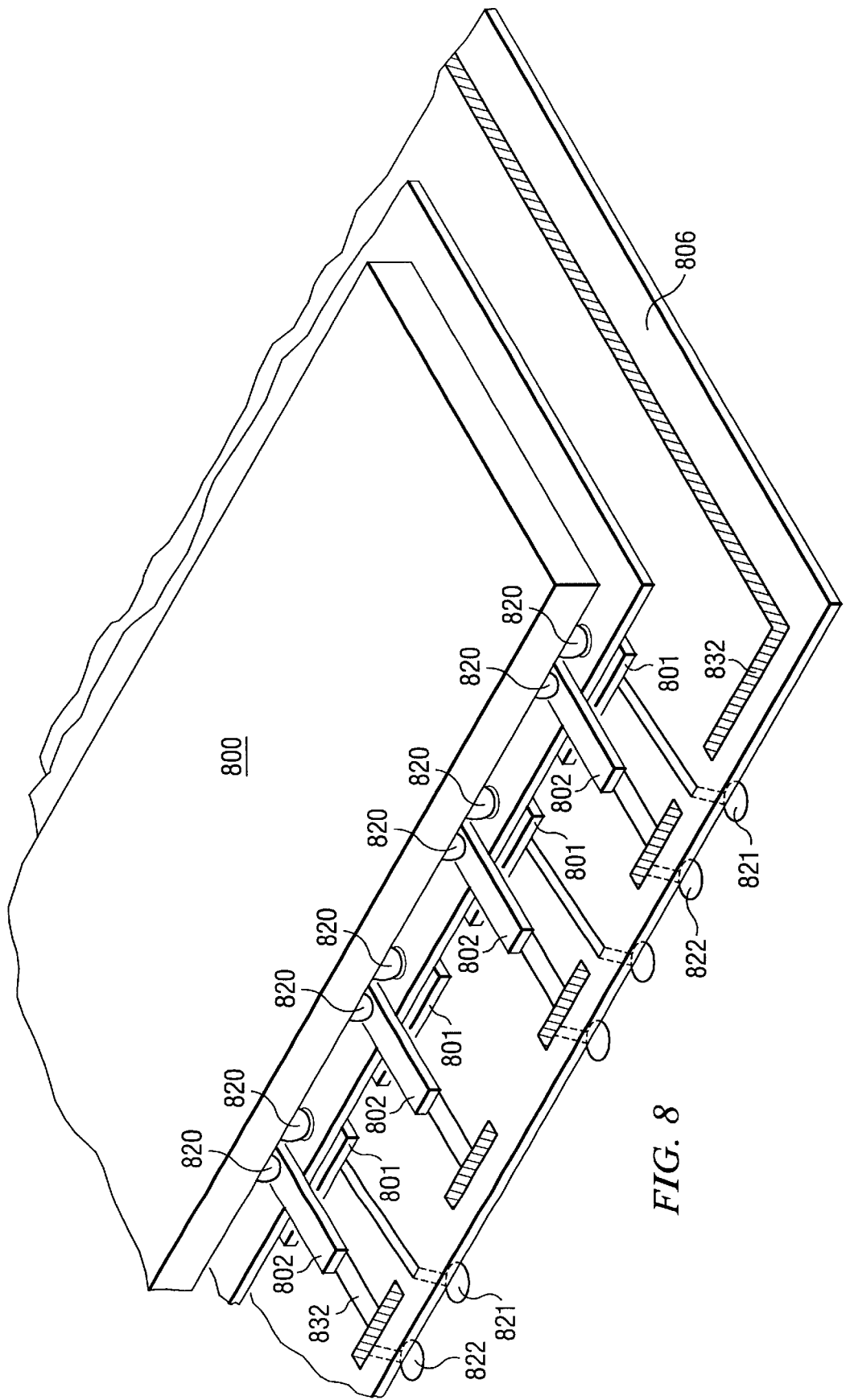
FIG. 8 is a flip chip bonded BGA package of the current invention.

In FIG. 8, an embodiment of the invention includes a flip chip interconnected integrated circuit chip 800 electrically connected by solder bumps 820 to a pattern of primary conductors 801 and auxiliary conductors 802 on the substrate 806. The primary conductors 801 on the surface of the substrate interconnect the solder bumps on the IC chip to the external signal leads or solder balls 821, and the auxiliary conductors 802 interconnect the chip ground contacts to the ground plane 832. External ground contacts are made through solder balls 822 by way of vias to the ground plane 832. Ground contacts to be excluded, as in the case of differential mode transmission lines, are avoided by removing designated solder balls prior to assembly onto the substrate. Conductive vias provide electrical connection between the primary 801 and secondary 802 conductors to external solder ball contacts 821 and 822.

The preferred embodiments, as demonstrated in FIGS. 7 and 8 include a ground plane 732, 832 within the package substrate. However, the ground plane often exists within the printed circuit board, rather than in the package itself and the configuration is usable with the current invention Ground contacts are made directly to the printed wiring board ground plane, avoiding the need for an additional layer within the package.

Figure 9:
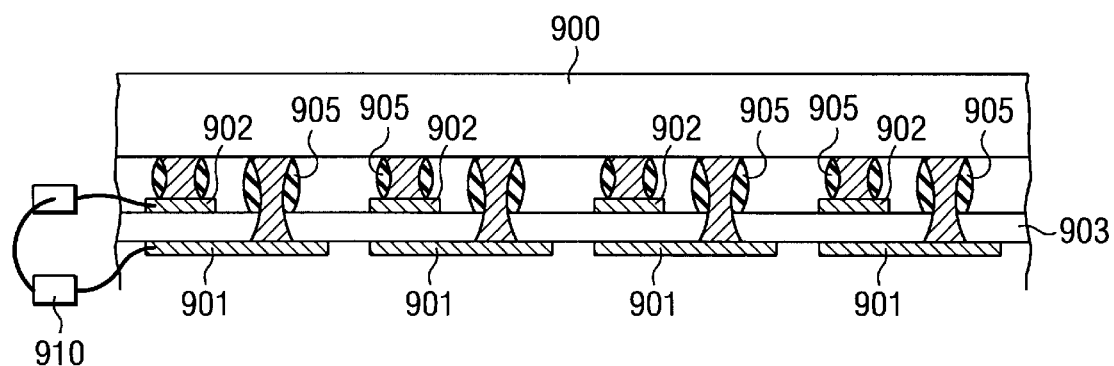
FIG. 9 is a cross section of a device of the current invention using a flex circuit substrate.

The conductor system of the current invention is applicable not only to rigid substrates, as illustrated in FIGS. 6, 7 and 8 wherein the conductors are supported on a rigid material and separated by a dielectric layer, but the system is also applicable to thin flex circuits. In FIG. 9, a cross section of a Flex Circuit device of the current invention is provided having a level of primary conductors 901 on one surface and an overlaying array of auxiliary conductors 902 on the alternate surface on a thin film dielectric 903, such as a polyimide film. The IC chip 900 has solder bump connections 905 to said conductors on the film substrate. External contacts to conductors 901 and 902 are made a perimeter contact pads 910.

The invention has been illustrated and described as a single chip package, but the overlying conductor system of this invention is equally applicable to multichip devices require controlled impedance transmission lines.

Further, packages or substrates having a conductor system of this invention include leaded devices, rather than those having solder ball connectors.

While preferred embodiments and some alternative applications of the invention have been described above, they are not intended to be limited, but instead it should be understood that various modifications may be made from the specific details described herein without departing from the spirit and scope of the invention as set forth in the appended claims.

What is claimed is:

1. An electrical conductor system for a microelectronic device wherein the impedance of individual leads is arbitrarily selected during assembly of said device, said system comprising;
    a) an array of primary conductors in a plane,
    b) an array of auxiliary conductors substantially overlaying said primary conductors,
    c) a dielectric layer separating said conductor layers,
    d) a ground plane separated from said conductors a by dielectric material, and
    e) a selectable connection between at least some of said array of auxiliary conductors and ground.

2. A conductor system as in claim 1 wherein the impedance is selected for either single ended or differential pairs of transmission lines, said system having primary conductors of the same size and equal spacing, and auxiliary conductors of the same size and equal spacing.

3. A conductor system as in claim 1 wherein the impedance is selected for single ended, for differential pairs, or for both single ended and differential pairs of transmission lines within the same device; said system having each of the primary conductors the same size, and each of the auxiliary conductors the same size.

4. A method of assembling the conductor system for a microelectronic device wherein the impedance of primary conductors is selected to form differential mode input and output pairs including the following steps;
    a) providing an array of primary conductors in a plane,
    b) providing an array of auxiliary conductors substantially overlying said primary conductors,
    c) separating said conductors by a dielectric layer,
    d) providing a ground plane separated from said conductors by a dielectric layer, and
    e) interconnecting said primary conductors to signal ports, and not connecting auxiliary conductors.

5. A method of assembling the conductor system for a microelectronic device having the impedance of primary conductors forming single ended transmission lines including the following steps;
    a) providing an array of primary conductors in a plane,
    b) providing an array of auxiliary conductors substantially overlying said primary conductors,
    c) separating said conductors by a dielectric layer,
    d) providing a ground plane separated from said conductors by a dielectric layer, and
    e) interconnecting said primary conductors to signal ports, and said auxiliary conductors to ground.

6. A semiconductor device having the impedance of individual leads arbitrarily selected, said device comprising;
    a) an integrated circuit chip,
    b) a conductor system as in claim 1, and
    c) a semiconductor package including a substrate, external leads and encapsulation.

7. A semiconductor device as in claim 6 wherein said means of interconnection is by wire bonding.

8. A semiconductor device as in claim 6 wherein said means of interconnection is by flip chip contacts.

9. A semiconductor device as in claim 6 wherein said package is a Ball Grid Array.

10. A semiconductor device as in claim 6 wherein said package includes a substrate for one or more semiconductor chips.

11. A method of assembling a semiconductor device wherein the impedance of primary conductors in the package or substrate forms differential mode input and output pairs including the following steps;
    a) interconnecting a semiconductor chip to an array of primary conductors in said package,
    b) providing an array of auxiliary conductors substantially overlying said primary conductors,
    c) providing a dielectric layer separating said conductors,
    d) providing a ground plane separated from said conductors by a dielectric layer, and
    e) interconnecting said primary conductors to external signal ports on said package, and auxiliary conductors not connected.

12. A method of assembling a semiconductor device wherein the impedance of primary conductors in the package or substrate forms single ended transmission lines including the following steps;
    a) interconnecting a semiconductor chip to an array of primary conductors in a plane,
    b) interconnecting a semiconductor chip to an array of auxiliary conductors substantially overlying said primary conductors,
    c) providing a dielectric layer separating said conductors, d) providing a ground plane separated from said conductors by a dielectric layer, and e) interconnecting said primary conductors to external signal ports, and auxiliary conductors to ground.

13. A flex circuit semiconductor device having the impedance of individual leads arbitrarily selected, said device comprising;

a) an integrated circuit chip having flip chip contacts, b) a flexible dielectric film having an array of primary conductors on the first surface, c) an array of auxiliary conductors on the second surface substantially overlaying said primary conductors, d) an array of conductive vias, e) an array of input/output contact pads on said film surfaces, f) an available ground plane external to said device, and g) a means to interconnect said conductors and said ground plane.

* * * * *